(12) United States Patent
Van De Mast et al.

(10) Patent No.: US 7,352,439 B2
(45) Date of Patent: Apr. 1, 2008

(54) LITHOGRAPHY SYSTEM, CONTROL SYSTEM AND DEVICE MANUFACTURING METHOD

(75) Inventors: Franciscus Van De Mast, Eindhoven (NL); Johan Christiaan Gerard Hoefnagels, Hooge Mierde (NL); Johannes Onvlee, s-Hertogenbosch (NL); Reinder Teun Plug, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 11/497,534

(22) Filed: Aug. 2, 2006

(65) Prior Publication Data

US 2008/0036983 A1    Feb. 14, 2008

(51) Int. Cl.
*G03B 27/42* (2006.01)
(52) U.S. Cl. .............................. 355/53; 355/77; 700/19
(58) Field of Classification Search ............. None
See application file for complete search history.

(56) References Cited

U.S. PATENT DOCUMENTS

| | | | |
|---|---|---|---|
| 7,167,766 B2 * | 1/2007 | Lam et al. | 700/96 |
| 2006/0114437 A1 * | 6/2006 | Akhssay et al. | 355/55 |
| 2006/0184264 A1 * | 8/2006 | Willis et al. | 700/108 |

FOREIGN PATENT DOCUMENTS

EP    1628164 A    2/2006

* cited by examiner

*Primary Examiner*—D. Rutledge
(74) *Attorney, Agent, or Firm*—Pillsbury Winthrop Shaw Pittman LLP

(57) ABSTRACT

A lithography system in which a performance criterion of the lithography system is predicted, based on one or more operating conditions of the lithography system, and compared to measurements of that performance criterion. The lithography system may determine from a difference between the measured and predicted performance criterion which, if any, sub-system of the lithography system is not performing as expected.

16 Claims, 3 Drawing Sheets

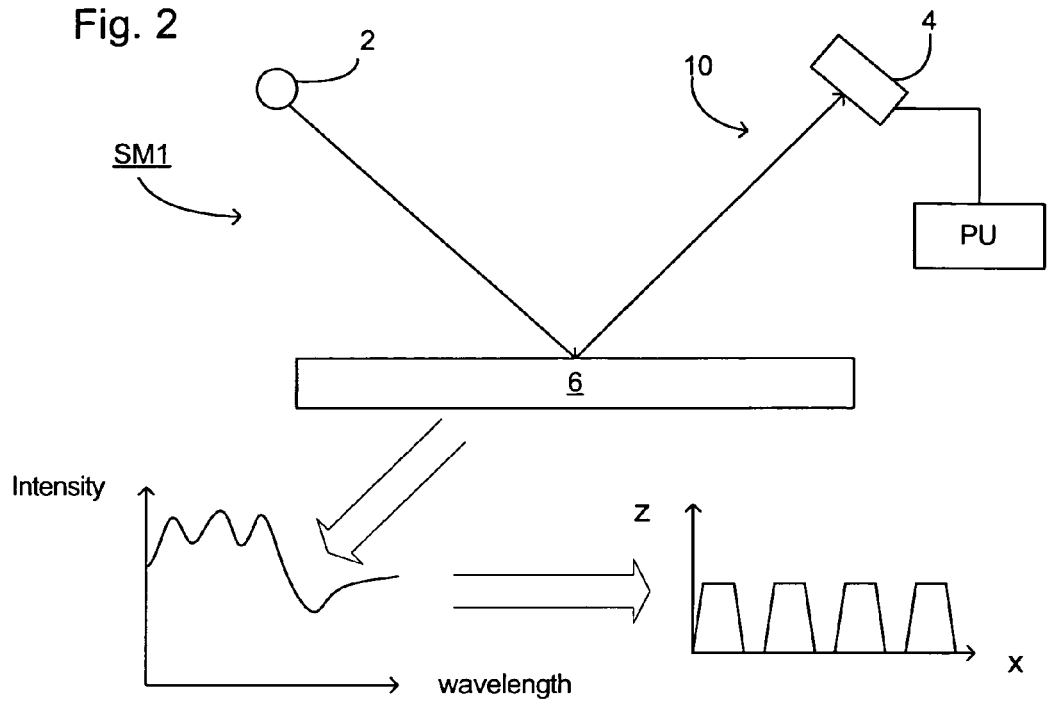
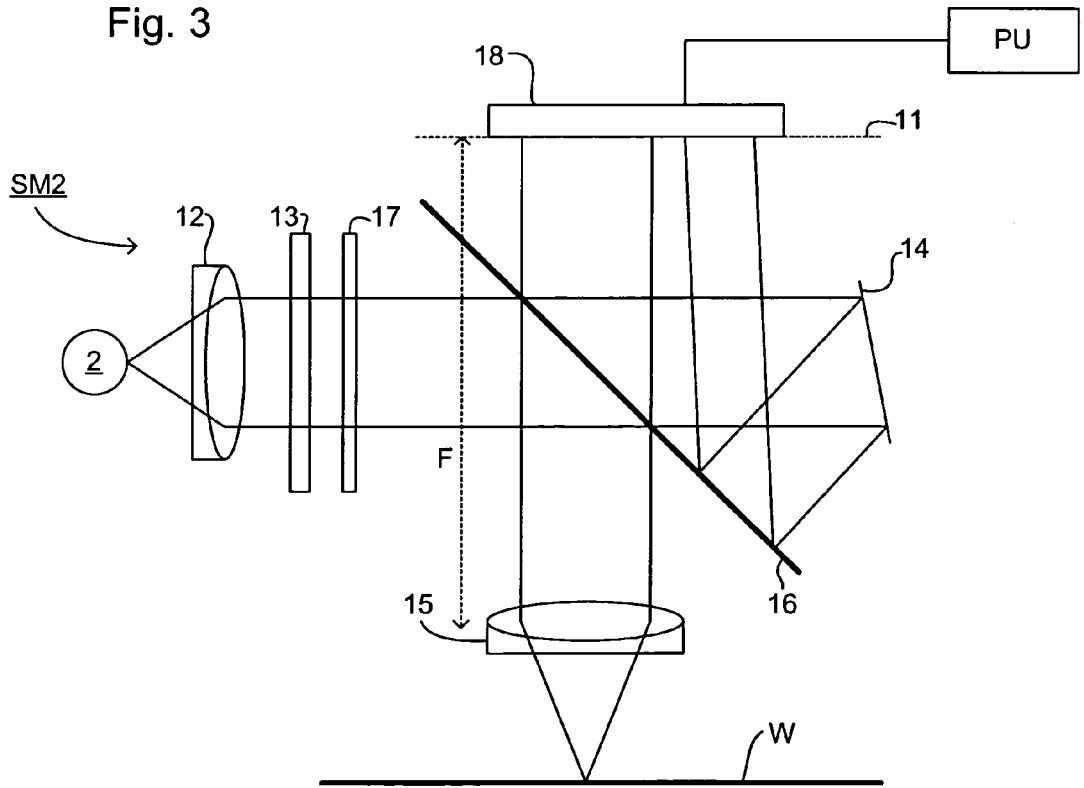

LITHOGRAPHY SYSTEM, CONTROL SYSTEM AND DEVICE MANUFACTURING METHOD

FIELD

The present invention relates to a lithography system, its control system and to a method of manufacturing devices using a lithographic technique, in particular employing a method of inspection usable, for example, in the manufacture of devices by a lithographic technique.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In order to monitor the lithographic process, it is necessary to measure parameters of the patterned substrate, for example the overlay error between successive layers formed in or on it. There are various techniques for making measurements of the microscopic structures formed in a lithographic process, including the use of a scanning electron microscope and various specialized tools. One form of specialized inspection tool is a scatterometer in which a beam of radiation is directed onto a target on the surface of the substrate and properties of the scattered or reflected beam are measured. By comparing the properties of the beam before and after it has been reflected or scattered by the substrate, the properties of the substrate can be determined. This can be done, for example, by comparing the reflected beam with data stored in a library of known measurements associated with known substrate properties. Two main types of scatterometer are known. A spectroscopic scatterometer directs a broadband radiation beam onto the substrate and measures the spectrum (intensity as a function of wavelength) of the radiation scattered into a particular narrow angular range. An angularly resolved scatterometer uses a monochromatic radiation beam and measures the intensity of the scattered radiation as a function of angle.

Scatterometry is an active field of research where optical techniques are used to measure subwavelength features of an object. An embodiment of the system of the present invention may be used with apparatus configured to measure the subwavelength features, such as an in-line metrology tool. Such a metrology tool detects a reflected beam that has been reflected from the surface of a substrate and more specifically from a specific target on the substrate, and from the reflected beam and its different diffraction orders, reconstructs the shape of the target on the substrate.

As manufacturing margins for the formation of, for example, integrated circuit devices become smaller and the complexity of lithographic apparatus becomes ever greater, it becomes more significant to monitor the performance of the equipment used in the various parts of the lithography process. Typically this involves executing dedicated tests for each sub-system or performance parameter. However, these tests are costly, time-consuming, do not always address on-product performance criterion and/or are often not very specific in identifying root-causes in errors that are detected. Furthermore, it is often the case that by the time such a test has been completed and the results analyzed, the tested sub-system will have processed many substrates in the whatever condition it is in. Accordingly, a large number of substrates may be processed by a faulty sub-system before the fault is detected, resulting in large numbers of substrates either needing re-work or, in some cases, scrapping. Clearly this may be very costly.

SUMMARY

It is desirable, for example, to provide a system in which a deviation from a desired performance level of a sub-system within a lithography system can be more easily identified.

According to an aspect of the invention, there is provided a lithography system comprising:

a performance prediction unit, configured to predict a performance criterion of the formation of a pattern on a substrate by the lithography system based on an operating condition of the lithography system;

an exposure unit, configured to expose a pattern of radiation on the substrate;

a performance measurement unit, configured to measure a performance criterion of the formation of the pattern on the substrate by the lithography system, the measured performance criterion corresponding to the predicted performance criterion;

a comparison unit, configured to compare the predicted performance criterion with the corresponding measured performance criterion; and a process controller, configured to control the lithography system, wherein subsequent control of the lithography system is regulated by the difference in the predicted and measured performance criterion determined by the comparison unit.

According to an aspect of the invention, there is provided a method of manufacturing a device using a lithography system comprising:

predicting a performance criterion of the formation of a pattern on a substrate by the lithography system, based on an operating condition of the lithography system;

exposing a pattern of radiation on the substrate;

measuring a performance criterion of the formation of the pattern on the substrate by the lithography system, the measured performance criterion corresponding to the predicted performance criterion; and comparing the predicted performance criterion with the corresponding measured performance criterion, wherein the subsequent control of the lithography system is regulated by the difference in the predicted and measured performance criterion.

According to an aspect of the invention, there is provided a computer program for controlling a lithography system comprising:

a performance prediction section, configured to predict a performance criterion of the formation of a pattern on a substrate by the lithography system based on an operating condition of the lithography system;

a performance measurement section, configured to measure a performance criterion of the formation of the pattern on the substrate by the lithography system, the measured performance criterion corresponding to the predicted performance criterion;

a comparison section, configured to compare the predicted performance criterion with the corresponding measured performance criterion; and a process control section, configured to control the lithography system, wherein the subsequent control of the lithography system by the process control section is regulated by the difference in the predicted and measured performance criterion determined by the comparison section.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 2 depicts a first scatterometer;

FIG. 3 depicts a second scatterometer; and

DETAILED DESCRIPTION

Figure 1A:
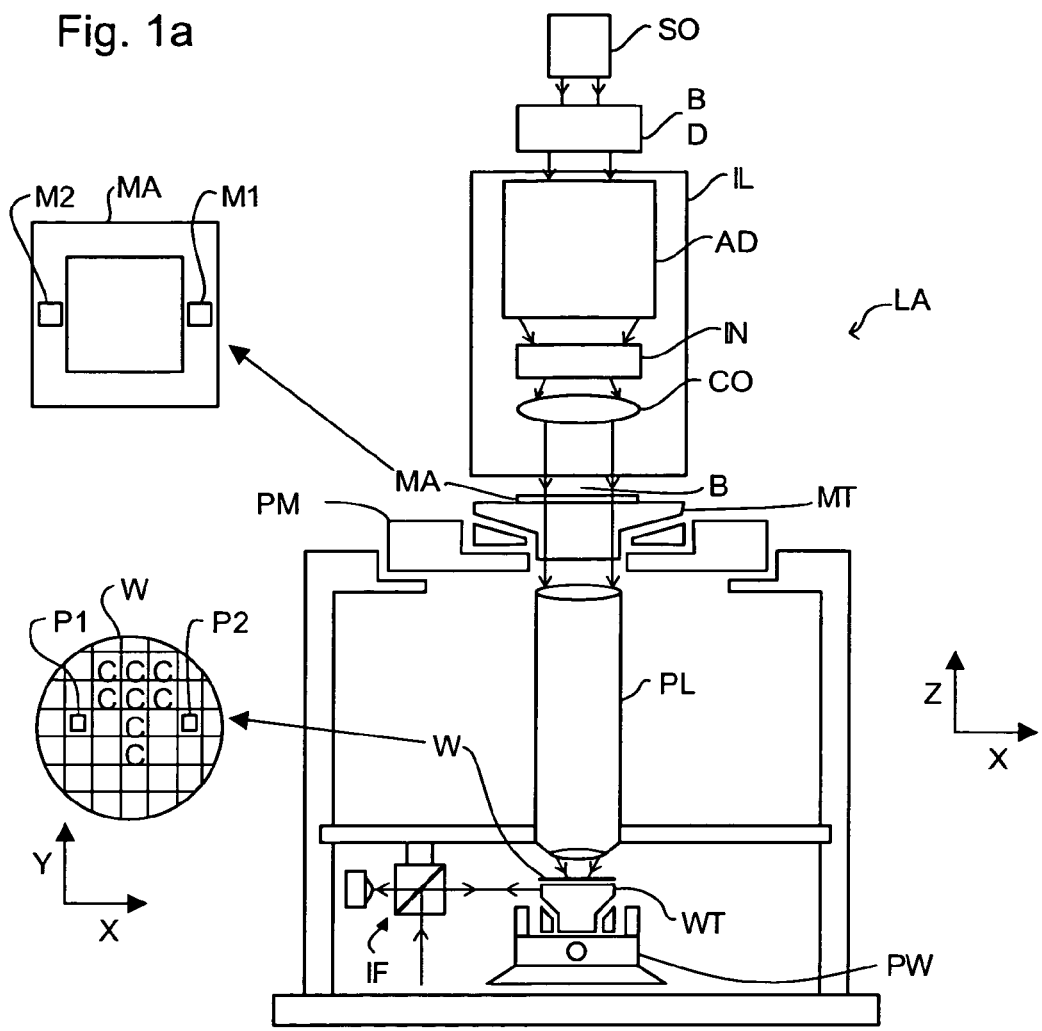
FIG. 1a depicts a lithographic apparatus.

FIG. 1a schematically depicts a lithographic apparatus. The apparatus comprises:

an illumination system (illuminator) IL configured to condition a radiation beam B (e.g. UV radiation or EUV radiation);

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PL configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more support structures). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1a, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. Having traversed the patterning device MA, the radiation beam B passes through the projection system PL, which focuses the beam onto a target portion C of the substrate W. With the aid of the second positioner PW and position sensor IF (e.g. an interferometric device, linear encoder, 2D encoder or capacitive sensor), the substrate table WT can be moved accurately, e.g. so as to position different target portions C in the path of the radiation beam B. Similarly, the first positioner PM and another position sensor (which is not explicitly depicted in FIG. 1a) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-) magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 1B:
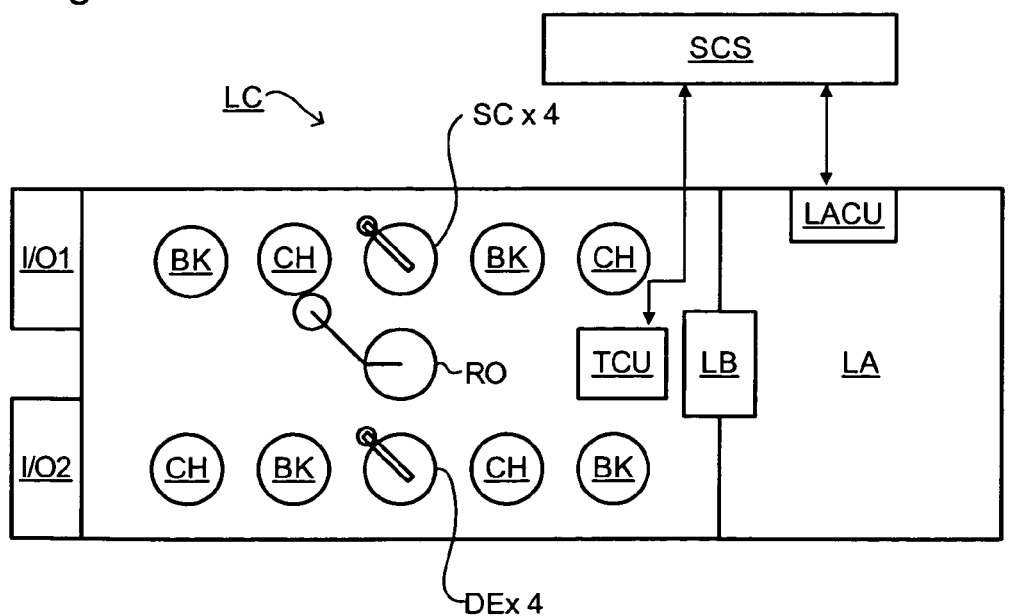
FIG. 1b depicts a lithographic cell or cluster.

As shown in FIG. 1b, the lithographic apparatus LA, also referred to as an exposure unit, forms part of a lithographic cell LC, also sometimes referred to a lithocell or cluster, which also includes apparatus to perform pre- and/or post-exposure processes on a substrate. Conventionally such apparatus may include one or more spin coaters SC to deposit resist layers, one or more developers DE to develop exposed resist, one or more chill plates CH and one or more bake plates BK. A substrate handler, or robot, RO, which may also be part of the lithographic cell picks up substrates from input/output ports I/O1, I/O2, moves them between the different process devices and delivers them to the loading bay LB of the lithographic apparatus. These devices, which are often collectively referred to as the track, are under the control of a track control unit TCU which itself may be controlled by a supervisory control system SCS, which may also control the lithographic apparatus LA. Thus, the different apparatus can be operated to maximize throughput and processing efficiency.

In general all of the apparatus used to form a device on the substrate may be referred to as a lithography system. It will be appreciated that this will include one or more lithographic apparatus, units to perform pre- and/or post-exposure processing of the substrate, at least some of which may be associated with a lithographic apparatus to form a lithographic cell such as the track described above and optionally including, for example, apparatus to perform etching steps and deposition steps, and apparatus to inspect substrates and features formed on the substrates.

In order that the substrates that are exposed by the lithographic apparatus are exposed correctly and consistently, it is desirable to inspect exposed substrates to measure properties such as overlay errors between subsequent layers, line thicknesses, critical dimensions (CD), etc. If errors are detected, an adjustment may be made to exposures of subsequent substrates, especially if the inspection can be done soon and fast enough that one or more other substrates of the same batch are still to be exposed. Also, one or more already exposed substrates may be stripped and reworked—to improve yield—or discarded—thereby avoiding performing exposure on a substrate known to be faulty. In a case where only one or some target portions of a substrate are faulty, further exposures can be performed only on those target portions which are good.

An inspection apparatus is used to determine the properties of the substrates, and in particular, how the properties of different substrates or different layers of the same substrate vary from layer to layer. The inspection apparatus may be integrated into the lithographic apparatus LA or the lithocell LC or may be a stand-alone device. To enable most rapid measurements, it is desirable that the inspection apparatus measure properties in the exposed resist layer immediately after the exposure. However, the latent image in the resist has a very low contrast—there is only a very small difference in refractive index between the parts of the resist which have been exposed to radiation and those which have not—and not all inspection apparatus have sufficient sensitivity to make useful measurements of the latent image. Therefore measurements may be taken after the post-exposure bake step (PEB) which is customarily the first step carried out on an exposed substrate and increases the contrast between exposed and unexposed parts of the resist. At this stage, the image in the resist may be referred to as semi-latent. It is also possible to make measurements of the developed resist image—at which point either the exposed or unexposed parts of the resist have been removed—or after a pattern transfer step such as etching. The latter possibility limits the possibilities for rework of faulty substrates but may still provide useful information.

FIG. 2 depicts a scatterometer which may be used in an embodiment of the present invention. It comprises a broadband (white light) radiation projector 2 which projects radiation onto a substrate W. The reflected radiation is passed to a spectrometer detector 4, which measures a spectrum 10 (intensity as a function of wavelength) of the specular reflected radiation. From this data, the structure or profile giving rise to the detected spectrum may be reconstructed by processing unit PU, e.g. by Rigorous Coupled Wave Analysis and non-linear regression or by comparison with a library of simulated spectra as shown at the bottom of FIG. 2. In general, for the reconstruction the general form of the structure is known and some parameters are assumed from knowledge of the process by which the structure was made, leaving only a few parameters of the structure to be determined from the scatterometry data. Such a scatterometer may be configured as a normal-incidence scatterometer or an oblique-incidence scatterometer.

Another scatterometer that may be used with an embodiment of the present invention is shown in FIG. 3. In this device, the radiation emitted by radiation source 2 is focused using lens system 12 through interference filter 13 and polarizer 17, reflected by partially reflective surface 16 and is focused onto substrate W via a microscope objective lens 15, which has a high numerical aperture (NA), for example, at least 0.9 or at least 0.95. Immersion scatterometers may even have lenses with numerical apertures over 1. The reflected radiation then transmits through partially reflective surface 16 to a detector 18 in order to have the scatter spectrum detected. The detector may be located in the back-projected pupil plane 11, which is at the focal length of the lens system 15, however the pupil plane may instead be re-imaged with auxiliary optics (not shown) to the detector. The pupil plane is the plane in which the radial position of radiation defines the angle of incidence and the angular position defines the azimuth angle of the radiation. In an embodiment, the detector is a two-dimensional detector so that a two-dimensional angular scatter spectrum of the substrate target can be measured. The detector 18 may be, for example, an array of CCD or CMOS sensors, and may use an integration time of, for example, 40 milliseconds per frame.

A reference beam is often used, for example, to measure the intensity of the incident radiation. To do this, when the radiation beam is incident on the partially reflective surface 16 part of it is transmitted through the partially reflective surface 16 as a reference beam towards a reference mirror 14. The reference beam is then projected onto a different part of the same detector 18.

A set of interference filters 13 is available to select a wavelength of interest in the range of, say, 405-790 nm or even lower, such as 200-300 nm. The interference filter may be tunable rather than comprising a set of different filters. A grating could be used instead of one or more interference filters.

The detector 18 may measure the intensity of scattered radiation at a single wavelength (or narrow wavelength range), separately at multiple wavelengths or integrated over a wavelength range. Furthermore, the detector may separately measure the intensity of transverse magnetic- and transverse electric-polarized radiation and/or the phase difference between the transverse magnetic- and transverse electric-polarized radiation.

Using a broadband radiation source (i.e. one with a wide range of radiation frequencies or wavelengths—and therefore of colors) is possible, which gives a large etendue, allowing the mixing of multiple wavelengths. The plurality of wavelengths in the broadband preferably each has a bandwidth of *8 and a spacing of at least 2*8 (i.e. twice the wavelength). Several "sources" of radiation can be different portions of an extended radiation source which have been split using fiber bundles. In this way, angle resolved scatter spectra can be measured at multiple wavelengths in parallel. A 3-D spectrum (wavelength and two different angles) can be measured, which contains more information than a 2-D spectrum. This allows more information to be measured which increases metrology process robustness. This is described in more detail in European patent application publication no EP 1628164A.

The target on substrate W may be a grating which is printed such that after development, the bars are formed of solid resist lines. The bars may alternatively be etched into the substrate. This pattern is sensitive to chromatic aberrations in the lithographic projection apparatus, particularly the projection system PL, and illumination symmetry and the presence of such aberrations will manifest themselves in a variation in the printed grating. Accordingly, the scatterometry data of the printed gratings is used to reconstruct the gratings. The parameters of the grating, such as line widths and shapes, may be input to the reconstruction process, performed by processing unit PU, from knowledge of the printing step and/or other scatterometry processes.

The purpose of rigorous optical diffraction theories in feature metrology is effectively the reconstruction of a diffraction spectrum that is reflected from the target or mark. In other words, target shape information is obtained for CD (critical dimension) uniformity and overlay metrology. Overlay metrology is a measuring system in which the overlay of two marks is measured in order to determine whether two layers on a substrate are aligned or not. CD uniformity is a measurement of the uniformity of the mark on the spectrum to determine how the exposure system of the lithographic apparatus is functioning. Specifically, CD, or critical dimension, is the width of the smallest object to be "written" on the substrate and it is important because it is a limit at which a lithographic apparatus is physically able to write on a substrate.

The way the measurement of the target shape (or "mark shape") may be carried out is as follows:

1. The target shape is estimated. This estimated shape is given different parameters such as $\alpha^{(o)}$, $\beta^{(o)}$, $\chi^{(o)}$, and so on. These parameters may be, for example, respectively the angle of each side wall, the height of the top of the mark, the width at the top of the mark, the width at the bottom of the mark, etc.

2. A rigorous optical diffraction method such as RCWA is used to obtain the estimated or model diffraction pattern of the estimated target shape.

3. The diffraction pattern of the actual target on the substrate is then measured by illuminating the target on the substrate with a radiation beam and detecting the diffracted beam, the pattern of which will be dependent on the properties of the target. This diffraction pattern and the model diffraction pattern are forwarded to a calculation system such as a computer.

4. The actual diffraction pattern and the model diffraction pattern are then compared. Each of the shape parameters is compared and any differences are fed into a "merit function" calculation.

5. Using the merit function, which relates the sensitivity of mark parameters to the shape of the diffraction pattern, new shape parameters are estimated.

The computation time of this iterative process is largely determined by the forward diffraction model, i.e. the calculation of the estimated diffraction model using a rigorous optical diffraction theory from the estimated mark shape. The rest is comparison and less calculation is required than would be required using a rigorous model to determine the shape directly from the measured diffraction pattern.

Figure 4:
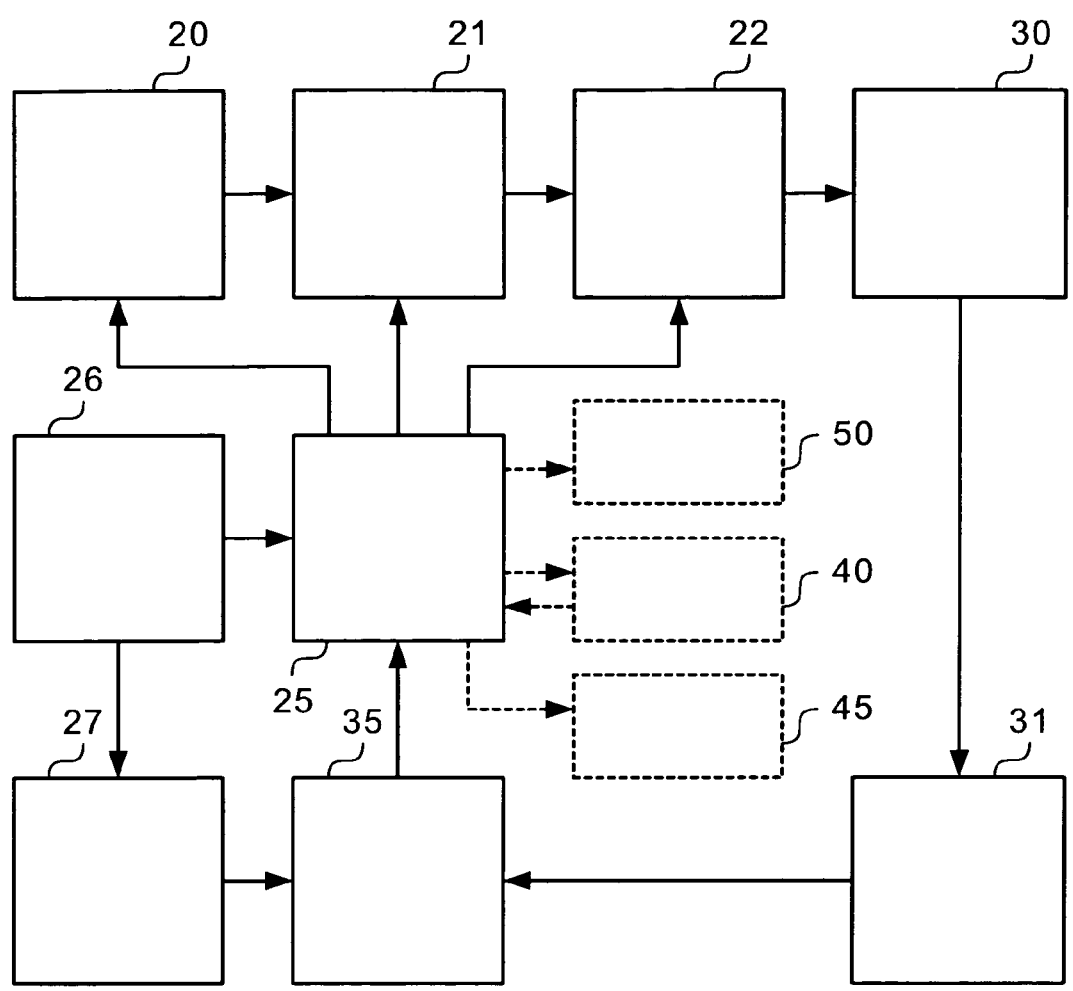
FIG. 4 depicts a lithography system according to an embodiment of the present invention.

A lithography system according to an embodiment of the present invention is depicted in FIG. 4. As shown, the lithography system includes a pre-exposure processing unit 20 to process a substrate prior to exposure, an exposure unit 21 to expose a pattern on the substrate and a post-exposure processing unit 22 to process a substrate after the pattern is exposed on the substrate. The lithography system further includes a system controller 25 that controls at least the exposure unit 21 and may control other parts of the lithography system, including the pre-exposure processing unit 20 and the post-exposure processing unit 22. It should be appreciated that although, as depicted in FIG. 4, the control system for the lithography system may be provided at a central resource, it may also be distributed among the components of the lithography system and/or may be provided separate from the lithography system.

The lithography system includes a memory 26 containing the operating conditions under which the lithography system operates. The system controller 25 may control the lithography system based on the operating conditions stored in the memory 26. Alternatively, the operating conditions of the lithography system may be set externally, in which case the operating conditions may be provided to the memory 26, for example either by the external source that provides them to the system controller 25 or by the system controller itself.

The lithography system further includes a performance prediction unit 27 that predicts at least one performance criterion of the formation of a pattern on the substrate based on one or more of the operating conditions stored in the memory 26. For example, the performance prediction unit 27 may include a mathematical model of the processes performed by the lithography system, from which it can calculate the expected performance of the lithography system operating under the operating conditions stored in the memory 26. Alternatively or additionally, the performance prediction unit 27 may be able to calculate an expected performance of the lithography system based on historical data of the performance of the lithography system previously with similar or corresponding operating conditions.

As depicted in FIG. 4, the performance prediction unit 27 may be a separate component of the lithography system from the system controller 25. Alternatively, the performance prediction unit may be part of, or integrated with, the system controller 25. Similarly, the performance prediction unit 27 may be provided externally to the lithography system and the predicted performance criterion may be provided to the lithography system, for example together with the operating conditions to be used.

The lithography system further includes a substrate inspection device 30 and a performance measurement unit 31 that, based on the inspection by the substrate inspection device 30, determines at least one performance criterion of the formation of the pattern on the substrate by the lithography system that correspond to the performance criterion predicted by the performance prediction unit 27. The substrate inspection device 30 and the performance measurement unit 31 may, for example, be a system based on scatterometry as described above. However, it should be appreciated that any system configured to measure the performance of the formation of the pattern on the substrate by the lithography system may be used.

Furthermore, it will be appreciated that, although the performance prediction unit 27 may determine the expected performance of the lithography system prior to the formation of the pattern on the substrate, or prior to the measurement by the substrate inspection device 30, or the determination by the performance measurement unit 31, the predicted performance may be determined at the same time as the measured performance or even afterwards. Likewise, although as depicted in FIG. 4, the substrate inspection device 30 may inspect the substrate after the substrate has been processed by the post-exposure processing unit 22, the performance measurement of the system may be based on measurements made immediately before or after the exposure of the pattern on the substrate.

The lithography system further includes a comparator 35 that determines the difference between the predicted performance criterion and the corresponding measured performance criterion. If the lithography system is performing as expected, for example according to the model that may be used in the performance prediction unit 27, one would expect there to be no difference between the predicted performance criterion and the measured performance criterion. Accordingly, any difference detected by the comparator 35 represents a deviation of the performance of the lithography system from the expected performance. As explained below, the system controller 25 may use this information in order to regulate the subsequent operation of the lithography system. Possible uses of this information are set out below as separate embodiments. It should be appreciated, however, that a lithography system according to an embodiment of the present invention may employ any combination of these embodiments or one or more aspects of these embodiments. As will be appreciated, more than one performance criterion may be predicted, measured and/or compared.

EMBODIMENT 1

As discussed above, a lithography system according to an embodiment of the present invention compares one or more predicted and measured performance criterion of the formation of a pattern on a substrate by the lithography system. The system controller 25, for example, may be configured such that if the difference between the predicted performance criterion and the measured performance criterion exceeds a given threshold, the operation of the lithography system is suspended. This may be beneficial because such a difference may suggest that the lithography system is operating in an unexpected manner. This may result in a pattern being formed on the substrate that includes errors. Accordingly, suspending the operation of the lithography system at this stage may prevent a pattern being erroneously formed on the substrate, thus reducing the need for re-work or scrapping of one or more substrates processed by the lithography system.

It will be appreciated that, where more than one performance criterion is being monitored, different thresholds may be set for each performance criterion. Likewise, for example, the operation of the lithography system may be suspended if the difference between the predicted and measured performance for two or more performance criterion both exceed a second, lower, negative threshold. Other combinations of thresholds may also be provided.

Alternatively or additionally, a lithography system according to the first embodiment may include a memory to store previously determined differences between the predicted and measured performance criterion, for example within the comparator 35. Accordingly, the rate of change of the differences between the predicted and measured performance criterion may also be monitored.

The lithography system may be configured such that, if the rate of change of the difference between a predicted and measured performance criterion exceeds a given threshold, the operation of the lithography system may be suspended. As before, different thresholds may be set for difference performance criterion or, for example, the operation of the lithography system may be suspended if the rate of change of the difference between the predicted and measured performance criterion for two or more performance criterion both exceed a second, lower, respective threshold. Likewise other combinations of thresholds and/or combinations of absolute thresholds relating to the difference and thresholds relating to the rate of change of the difference may also be used. Suspending the operation of the lithography system due to an excessive rate of change of the difference between the predicted and measured performance criterion may be beneficial because it may suggest that the lithography system has become unstable.

EMBODIMENT 2

In a lithography system according to the second embodiment, the system controller 25 is configured to recognize one or more characteristic patterns in the performance criterion data, as discussed in more detail below. Such a characteristic pattern may, for example, correspond to the performance of one or more individual sub-systems within the lithography system. Accordingly, by analysis of the characteristic pattern, the system controller may be able to determine the level of performance of one or more of the sub-systems.

Examples of such sub-systems include the illuminator, the projection system and/or the mask or substrate tables of the exposure unit, a transport unit and/or component within the pre- and post-exposure processing units, such as a bake plate to heat substrates, a chill plate to cool substrates, a spin-coater, for example, to apply resist, and/or a developer to develop exposed resist. The sub-systems may also relate to one or more parts of the lithography system not included in a lithocell, such as, for example, an etcher and/or polisher.

If a level of performance of one of the sub-systems, as determined by the system controller from a characteristic pattern of differences between the predicted and measured performance criterion, is beyond a given threshold (for example, the performance is not sufficient), the operation of the lithography system may be suspended. It will be appreciated that the threshold performance level for one or more sub-systems may be different. Likewise, as before, the operation of the lithography system may be suspended, for example, if the performance of two or more sub-systems is beyond a second, different, respective threshold or any combination of thresholds is passed. Likewise, the rate of change of performance of one or more sub-systems may be monitored, for example by the system controller 25 or the comparator 35 and the operation of the lithography system may be suspended if the rate of change of performance of a sub-system exceeds a certain threshold, if the rate of change of performance of two or more of the sub-systems exceeds a second, lower, respective threshold or if any combination of absolute performance thresholds and rate of change of performance thresholds is exceeded. As with the first embodiment, an excessive rate of change of the performance of one or more of the sub-systems may indicate that the lithography system is unstable.

A lithography system may include two or more sub-systems of a particular kind. For example, a lithocell may include more than one of one or more selected from a chiller plate, bake plate, spin-coater or developer module. Likewise, a lithography system is likely to include a plurality of lithocells. Therefore, the lithography system may include a substrate routing memory 40 that records which of the sub-systems is used to perform each of the processes on a given substrate. Accordingly, by using the information in the substrate routing memory 40 it is possible to determine which sub-system performed a given process on a substrate and therefore to associate any sub-system performance information derived from a given substrate with the appropriate sub-system. If it is determined that a particular sub-system of one kind is not performing satisfactorily, the operation of that sub-system may be suspended. However, if the lithography system includes one or more other sub-systems of that type, the operation of the lithography system as a whole need not be suspended because a substrate can be routed to the other sub-system(s) of that type.

It should be appreciated that the substrate routing memory 40 may not only include historical data relating to the routing of one or more substrates but may also include routing information for one or more substrates that are yet to be processed. Accordingly, the system controller 25 may use the information from the substrate routing memory 40 to control the routing of one or more substrates. Accordingly, if a sub-system is suspended from operation, the system controller 25 may adjust the data in the substrate routing memory 40 for one or more subsequent substrates to be processed in order to route that substrate(s) to one or more other sub-systems of the same kind.

EMBODIMENT 3

A lithography system according to the third embodiment may be arranged similarly to the second embodiment such that it can determine the performance of one or more of the sub-systems of the lithography system. However, alternatively or additionally to suspending the operation of the lithography system or a sub-system of the lithography system, the lithography system of the third embodiment may be configured such that, when the performance of a sub-system is beyond a given threshold or the rate of change of the performance of the sub-system exceeds a given threshold, corrective action is taken. For example, the system controller may be configured in such a circumstance to schedule one or more selected from maintenance, repair, replacement (where it is possible) or calibration of the sub-system. In particular, the lithography system may be configured such that, not only can it be determined which sub-system is not performing in the desired manner but it can also determine from the characteristic pattern of the differences between the predicted and measured performance criterion the nature of the fault within the sub-system. The lithography system may alternatively or additionally be arranged to notify an operator of the system, for example such that the operator can investigate the sub-system and determine whether or not any further corrective action is required.

EMBODIMENT 4

As with the second and third embodiments, a lithography system according to the fourth embodiment is arranged to determine the level of performance of one or more of the sub-systems of the lithography system from one or more characteristic patterns of the differences between the predicted and measured performance criterion for the formation of a pattern on a substrate. In addition, the fourth embodiment includes a sub-system performance memory 45 that records the performance history of one or more of the sub-systems. This may be useful, especially for one or more critical sub-systems, where verification of the performance of the lithography system may be required. It may also be useful, where a fault does occur, for identifying the nature and/or cause of any such fault.

EMBODIMENT 5

The system controller 25 of a lithography system according to the fifth embodiment may be configured such that, from the sub-system performance measurements determined in the same manner as any of the second to fourth embodiments, the system controller can determine an optimum routing of a substrate through the lithography system in order to provide the best possible or at least improved performance of the lithography system for the formation of a pattern on that substrate. For example, for each kind of sub-system required to process the substrate, the system controller may select the sub-system within the lithography system that is achieving the best level of performance.

Alternatively or additionally, the system controller may be configured such that it can select one of a first kind of sub-system and another of a second kind of sub-system such that the deviation of one of the sub-systems from its desired performance compensates for the deviation of the other of the sub-systems from its desired performance. In other words, instead of selecting the best performing sub-system from each kind, the system controller may select the best combination of sub-systems. It should be appreciated that the identification of sub-systems that, when used together, provide optimum performance is not limited to pairs of sub-systems. Groups of three or more sub-systems that provide optimum performance when combined may be identified.

Such an arrangement as provided by the fifth embodiment may be especially beneficial because the required performance level of the lithography system may vary between jobs. Accordingly, it may be desired to select an optimum performing route for the formation of a pattern on substrates that require the best possible performance level and use a less highly performing route for the formation of a pattern on substrates for which the performance is not critical.

Alternatively or additionally, the system controller may be configured such that one or more performance criterion are optimized, possibly at the cost of others. For example, the CD and/or overlay performance may be optimized at the cost of productivity performance. As a further example, productivity performance may be maximized subject to performance criterion such as CD and/or overlay reaching a minimum requirement.

EMBODIMENT 6

As with the fifth embodiment, a lithography system according to the sixth embodiment may be configured such that it can determine the level of performance of each of the sub-systems of the lithography system and can determine the overall performance of the lithography system for a substrate processed by a given combination of such sub-systems. The lithography system may be further configured such that as well as, or instead of, determining the optimum route for a substrate in order to provide the best performance of the lithography system, it can determine one or more routes that merely provide sufficient performance capability to form a particular pattern on a substrate. Accordingly, a route yielding better performance of the lithography system may be reserved for the formation of a pattern on substrates where better performance of the lithography system is required.

The lithography system may include a pattern analyzer, for example within the system controller 25, that analyzes a pattern to be formed on the substrate and determines a level of performance that may be required to form the pattern on the substrate (from which the system controller may determine the appropriate route through the lithography system for the substrate).

EMBODIMENT 7

A lithography system according to the seventh embodiment may be configured such that, as with previous embodiments, it can determine the performance of one or more sub-systems within the lithography system following the measurement of one or more performance criterion for the formation of a pattern of a substrate. Accordingly, the system controller 25 of the seventh embodiment may, from the performance of one or more of the sub-systems, determine whether or not that performance of the formation of the pattern on that substrate has been satisfactory. If the performance has not been satisfactory, the system controller may divert the routing of the substrate such that the substrate may be (at least partially) re-worked or, if necessary, scrapped. Spotting that the processing of the substrate has been unsatisfactory at an early stage may prevent additional work being performed on a substrate that will subsequently have to be re-done or scrapped.

EMBODIMENT 8

As with the seventh embodiment, a system controller 25 of a lithography system according to the eighth embodiment monitors the performance of the pattern formation on the substrate and may determine whether or not the performance of the pattern formation on a substrate is satisfactory. The lithography system further includes a substrate pattern formation performance memory 50 that records, for each substrate, the performance of the processes carried out on each substrate. This may be beneficial because, for some devices that are formed on substrates, such as microprocessors, although the nominal pattern formed on the substrate may be the same for two different classes of the device, the quality of the performance of the processes used to form the device may determine whether or not the device is in the class having a higher performance of the device or a class having a lower performance of the device. Clearly, the higher the performance of the device, the more value it has. By monitoring the performance of the processes by which the device is formed, the system controller 25 of the eighth embodiment may identify substrates for which, as a result of one or more previous processes being formed at a lower performance level, the device being formed will only be able to attain the given performance level that is lower than optimum. In such a situation, it may not be worthwhile forming the remainder of the device at the highest quality because of the limitation on the quality of the device imposed by the relatively low performance level of the already completed process(es).

Therefore, from the substrate pattern formation performance memory 50, the system controller 25 may determine for each substrate the required level of performance of the lithography system at which to perform one or more subsequent processes on the substrate at the level necessary to produce a device having the maximum remaining possible performance level, given the performance of one or more previous processes.

It should be appreciated that the system controller may be configured such that if part of a substrate can be processed at a higher performance level than the remainder of the substrate, the system controller selects one or more sub-systems to process the substrate such that at least that part of the substrate continues to be processed at the higher performance level, regardless of whether or not this results in a second part of the substrate being processed by one or more sub-systems that have a lower performance level for that second area of the substrate.

As discussed above, an embodiment of the present invention is based on a comparison of the predicted performance criterion of the lithography system and the measured performance criterion of the lithography system. One or more performance criterion may be used.

By way of example, the performance criterion used may be one or more selected from, but not limited to, the critical dimension of the pattern, the overlay error, the iso-dense bias, namely the difference between the critical dimension of sparsely arranged pattern features and the critical dimension of densely arranged pattern features, and the difference in the formation of differently-oriented elongate features in the pattern. Such performance criterion are commonly used to characterize the performance of a pattern formed on a substrate. They may, for example, be determined for one or both of a test structure (or target as discussed above) and a structure that is part of a device being formed on a substrate.

An alternative or additional performance criterion of the formation of a pattern on the substrate may be the productivity of each of the processes performed by the sub-systems, namely the time taken by each sub-system to perform an associated process on the substrate and/or the overall productivity of the lithography system. Each sub-system may have an expected time to perform each process and a deviation from this time may be indicative of a problem with the process or a previous process. For example, during the exposure of a substrate using the scan mode, as described above, the position of the substrate relative to the projection beam of radiation may be adjusted to take into account the surface variations of the substrate. As a result, if there are a significant number of surface variations, the scan speed may need to be reduced, resulting in a longer time being required to expose the substrate. Therefore, an increased time being required for an exposure process may be indicative of a problem during a pre-exposure process, resulting in such surface variations, for example.

It should be appreciated that, regardless of the performance criterion considered, the lithography system may predict and measure the performance criterion for a plurality of different areas on the substrate. Accordingly, the output of the comparator 35 may, for example, be a distribution of the difference between the predicted and measured critical dimension of the pattern across the entirety of the substrate.

As discussed above, differences between the predicted and measured performance criterion may have a characteristic pattern from which it may either be determined which of the sub-systems is not performing as expected or the level of performance of one or more of the sub-systems may be determined. Such a characteristic pattern may be apparent from the differences between the predicted and the measured performance criterion or from a combination of such differences and the actual performance criterion as measured. In any case, the characteristic pattern may be apparent at a variety of levels.

Firstly, a characteristic pattern may be apparent across, for example, the exposure field of the exposure unit, for example resulting in larger differences between the predicted and measured performance criterion on one side of the exposure field than the other.

Secondly, the characteristic pattern may be apparent within each area corresponding to a single device to be formed on the substrate. Such areas, commonly referred to as "dies", are typically exposed within a single scan of the projection beam of radiation relative to the substrate. If a characteristic pattern is repeated within all such areas on a substrate or an anomaly is identified at a characteristic location within the die this may provide useful information regarding the source or nature of any problem. It will be appreciated that, as a result of the nature of the exposure process, some dies may be exposed as the exposure field scans across it in a first direction while other dies are exposed by a scan of the exposure field in the opposite direction. If the characteristic pattern is only produced in dies in which the scan has been performed in a given direction or the characteristic patterns are different for dies that are scanned in the opposite direction, further information regarding the source or nature of the error may be provided.

Thirdly, a characteristic pattern may be produced across the entirety of a given substrate, regardless of the arrangement of the exposures of individual dies on the substrate. Such a pattern may indicate, for example, that the variation in the performance results from one or more processes performed before or after the exposure of the substrate rather than as a result of a deviation from the expected performance in the exposure unit.

Fourthly, a characteristic pattern may be apparent from within a batch of substrates processed by the lithography system or by comparing different batches of substrates processed by the lithography system. For example, a pattern may appear on some substrates within the batch but not on others. In simple cases, it may be apparent that a pattern of errors or deviations only occurs when a particular sub-system is used to perform a process on those substrates, clearly indicating that the deviation in performance is derived from that sub-system. In other cases, the deviation may only occur where a particular combination of two or more sub-systems are used to perform processes on a substrate. As a further example, it may be apparent that a particular deviation in the expected performance consistently occurs at a given position within a batch, such as in the first or last substrate of the batch.

Finally, a pattern may be related to the time at which the substrate is processed by the lithography system. For example, some variations may occur at a particular time of day which may assist in identifying their cause. In particular, if the variation occurs at a time of day when a specific event occurs within the production facility then it may be identified that there is a link between that event and the deviation in performance. As a further example, some variations may occur at a particular time relative to a process being performed that is not directly directed to the operation of the lithography system. For example it may be identified that a variation regularly occurs after the apparatus has been sitting idle for a given length of time, has been in use for a given length of time or in a process immediately after a calibration step is performed on a different but related sub-system, indicating that this is the cause of the deviation in performance.

EXAMPLES

The following are examples of characteristic patterns that may be identified:

1. Substrates that are exposed while mounted to only one of two substrates tables within an exposure unit show an increased difference between the predicted and measured critical dimension and/or overlay errors. This may indicate an error in the servo mechanism associated with that substrate table.

2. The first substrate within a batch shows an increased difference between the predicted and measured critical dimension. This may indicate errors related to the stability of the system, such as the temperature control of one or more critical components.

3. The difference between the predicted and measured critical dimension of the pattern varies across the exposure field of each die of the substrate. This may indicate a change in the illuminator uniformity.

4. The difference between the predicted and measured critical dimension is significantly greater for dense lines than for isolated lines. This may indicate a variation in the radiation dose used for the exposure but is most likely not caused by an error in the focus control. Likewise, if the difference is greater for isolated lines, it is more likely that the problem is caused by an error in the focus control.

5. The difference in the predicted and measured critical dimension is different for horizontal and vertical lines. This may suggest an error in the projection system or the illuminator system but not in the stage(s).

6. A difference in the predicted and measured critical dimension occurs after a long idle time of the lithography system. This suggests that some part of the lithography system has not had sufficient time to be prepared for continued operation and, for example, reached a stable operating temperature.

7. The difference in predicted and measured critical dimension suddenly increases for a group of substrates in a second part of a batch of substrates, for isolated lines in a particular area of the substrates. This sudden large focus error may suggest contamination on the substrate table.

8. The difference between the predicted and measured critical dimension occurs each time a particular patterning device (e.g., mask) is used. This suggests that there is a fault with the patterning device.

9. The difference between the predicted and measured critical dimension varies according to the distance from the center of the substrate. This may indicate a deviation from the expected performance of an etcher sub-system.

10. The difference between the predicted and measured overlay error varies across the substrate with a pattern of twists and twirls. This may indicate, for example, a deviation from the expected performance of a chemical mechanical polishing sub-system or a variation in the thickness of the resist applied to the substrate caused by radial movement of the spin coat nozzle used to apply the resist in combination with acceleration of the substrate rotation.

As discussed above, the prediction of the performance criterion is based on a model of the lithography system. The model of the system may, for example, include one or more of the following operating conditions of the lithography system as model parameters: the measured performance of the projection system, such as through slit performance focal plane errors, aberrations, stray radiation and numerical aperture; the measured stage performance for the patterning device (e.g., mask) stage and the one or more substrate stages, including the servo error (moving average and moving standard deviation) for both horizontal and vertical movements; the nature of the illuminator pupil, in particular the nominal shape, shape variations through the slit, the intensity distribution, intensity variations through the slit and polarization uniformity; the measured exposure dose; and known sensitivity for any of the above parameters (which may be derived with a commercial simulator package based on the geometry of the image to be performed). In addition, the model for the resist, namely its composition and known responses (which is typically provided by the resist vendor) and the patterning device critical dimension error (which is also often provided by the patterning device maker) may be included in the model.

It will be appreciated that the larger the number of operating conditions taken into account in the model, the more accurately it may predict the behavior of the lithography system. However, the greater the number of parameters, the more complex the model and the larger the number of calculations that may be required in order to predict the performance criterion.

In an embodiment, the model is set up such that the performance criterion prediction unit 27 can determine the predicted performance criterion on-the-fly, namely during the operation of the lithography system such that it can use operating conditions data gathered during the process. It will be appreciated that the model may be configured such that some of the calculations, involving operating conditions data that is not measured during the operation of the lithography system (and may not be updated frequently), are performed in advance.

Although specific reference may be made in this text to the use of lithographic apparatus or systems in the manufacture of ICs, it should be understood that the lithographic apparatus and system described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in conjunction with other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

The invention claimed is:

1. A lithography system comprising:
a performance prediction unit, configured to predict a performance criterion of the formation of a pattern on a substrate by the lithography system based on an operating condition of the lithography system;
an exposure unit, configured to expose a pattern of radiation on the substrate;
a performance measurement unit, configured to measure a performance criterion of the formation of the pattern on the substrate by the lithography system, the measured performance criterion corresponding to the predicted performance criterion;
a comparison unit, configured to compare the predicted performance criterion with the corresponding measured performance criterion; and
a process controller configured to determine, based upon a difference in the predicted performance criterion and the corresponding measured performance criterion as determined by the comparison unit, which, if any, sub-system of the lithography system is not functioning in an expected manner, and configured to control the lithography system,
wherein subsequent control of the lithography system is regulated by the difference in the predicted performance criterion and the corresponding measured performance criterion determined by the comparison unit.

2. The system of claim 1, wherein if the difference between the predicted performance criterion and the corresponding measured performance criterion or the rate of change of the difference exceeds a respective threshold, at least one of the following occurs: a notification is issued, corrective action is taken, corrective action is scheduled, or the operation of at least part of the lithography system is suspended.

3. The system of claim 1, comprising a plurality of sub-systems that are configured to perform the same process and a substrate routing memory configured to store information from which it can be determined which individual sub-system has performed or will perform each process for a substrate; and
wherein the process controller is configured to use the substrate routing memory information in order to determine which specific, if any, sub-system is not functioning in an expected manner.

4. The system of claim 3, wherein the process controller is configured such that, if the deviation of the performance of a sub-system from the expected manner, or the rate of change of the deviation, exceeds a respective threshold, the process controller changes the substrate routing memory information for one or more substrates yet to be processed such that a process that was to be performed by the sub-system is performed by one or more other sub-systems configured to perform the same process.

5. The system of claim 3, wherein the process controller is configured to determine, based upon a difference in the predicted and measured performance criterion as determined by the comparison unit, a level of performance attainable by each sub-system and to set the substrate routing memory information for a substrate such that a process performed on the substrate is performed by one or more of the sub-systems necessary to achieve a desired performance of the pattern formation on the substrate.

6. The system of claim 5, wherein the process controller is configured to determine the required performance of the pattern formation for the substrate from an analysis of features of the pattern to be formed.

7. The system of claim 1, wherein the process controller is configured to initiate (i) a maintenance process, or (ii) a repair process, or (iii) a replacement process, or (iv) a calibration process, or (v) any combination of (i)-(iv) for a sub-system when it determines that deviation of performance of the sub-system from expected performance, or the rate of change of the deviation, exceeds a respective threshold.

8. The system of claim 1, wherein the performance criterion includes (i) a critical dimension of the pattern, or (ii) an overlay error, or (iii) iso-dense bias, or (iv) a difference in the formation of differently-oriented elongate features in the pattern, or (v) any combination of (i)-(iv).

9. The system of claim 1, wherein the performance criterion is predicted and measured for a plurality of different locations on the substrate.

10. The system of claim 9, wherein a characteristic pattern of differences between the predicted and measured performance criterion is associated with variations in the performance of one or more sub-systems of the lithography system; and the process controller is configured to determine the performance of at least one of the sub-systems based on a recognition of the characteristic pattern.

11. The system of claim 10, further comprising a sub-system performance memory configured to record the performance of the at least one sub-system determined by the process controller.

12. The system of claim 10, wherein the characteristic pattern includes (i) variations across the exposure field, or (ii) variations across each device to be formed on a substrate, or (iii) variations across the substrate as a whole, or (iv) variations between substrates within a batch, or (v) variations related to the time and/or date that the substrate is processed, or (vi) any combination of (i)-(v).

13. The system of claim 1, wherein the performance criterion includes a time taken by a sub-system of the lithography system to perform an associated process on the substrate.

14. The system of claim 1, comprising at least one selected from the following: an illuminator configured to condition a projection beam of radiation, a patterning device configured to pattern the projection beam of radiation, a stage configured to hold the patterning device and control its position, a projection system configured to project the patterned beam of radiation onto a substrate, or a stage configured to hold the substrate and control its position, and wherein the operating condition of the lithography system used to determine the prediction of the performance criterion includes at least one selected from the following, as applicable: focal plane error, or aberration error, or stray radiation or numerical aperture of the projection system, or servo error of the stage configured to hold the patterning device, or servo error of the stage configured to hold the substrate, or nominal shape of an illuminator pupil of the illuminator, or shape variations through a slit of the illuminator pupil, or intensity variations through the slit of the illuminator pupil, or polarization uniformity across the illuminator pupil, or dose of radiation in each exposure, or nature of the resist applied to the substrate, or critical dimension error of the patterning device.

15. A method of manufacturing a device using a lithography system comprising:

predicting a performance criterion of the formation of a pattern on a substrate by the lithography system, based on an operating condition of the lithography system, wherein the operating condition of the lithography system used to determine the prediction of the performance criterion includes at least one selected from the following: focal plane error, or aberration error, or stray radiation, or numerical aperture of a projection system, or servo error of a stage configured to hold a patterning device, or servo error of a stage configured to hold a substrate, or nominal shape of an illumination pupil of an illuminator, or shape variations through a slit of an illumination pupil of an illuminator, or intensity variations through a slit of an illumination pupil of an illuminator, or polarization uniformity across an illumination pupil of an illuminator, or dose of radiation in each exposure, or nature of a resist applied to the substrate;

exposing a pattern of radiation on the substrate;

measuring a performance criterion of the formation of the pattern on the substrate by the lithography system, the measured performance criterion corresponding to the predicted performance criterion; and comparing the predicted performance criterion with the corresponding measured performance criterion, wherein the subsequent control of the lithography system is regulated by the difference in the predicted performance criterion and the corresponding measured performance criterion.

16. A computer readable media containing program instructions to control a lithography system, the program instructions comprising:

a performance prediction section, configured to predict a performance criterion of the formation of a pattern on a substrate by the lithography system based on an operating condition of the lithography system;

a performance measurement section, configured to measure a performance criterion of the formation of the pattern on the substrate by the lithography system, the measured performance criterion corresponding to the predicted performance criterion;

a comparison section, configured to compare the predicted performance criterion with the corresponding measured performance criterion; and a process control section, configured to control the lithography system, wherein the subsequent control of the lithography system by the process control section is regulated by the difference in the predicted performance criterion and the corresponding measured performance criterion determined by the comparison section, wherein if the rate of change of the difference exceeds a respective threshold, at least one of the following occurs: a notification is issued, corrective action is taken, corrective action is scheduled, or the operation of at least part of the lithography system is suspended.

* * * * *